(12) United States Patent
Pereverzev (10) Patent No.: US 11,727,296 B2
(45) Date of Patent: *Aug. 15, 2023

(54) ULTRA LOW NOISE MATERIALS AND DEVICES FOR CRYOGENIC SUPERCONDUCTORS AND QUANTUM BITS

(71) Applicant: Lawrence Livermore National Security, LLC, Livermore, CA (US)

(72) Inventor: Sergey Pereverzev, San Ramon, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 1163 days.

This patent is subject to a terminal disclaimer.

(21) Appl. No.: 16/379,651

(22) Filed: Apr. 9, 2019

(65) Prior Publication Data
US 2019/0236476 A1 Aug. 1, 2019

Related U.S. Application Data

(62) Division of application No. 14/711,718, filed on May 13, 2015, now Pat. No. 10,318,880.

(51) Int. Cl.
*C30B 29/00* (2006.01)
*G06N 10/00* (2022.01)
(Continued)

(52) U.S. Cl.
CPC ............ *G06N 10/00* (2019.01); *C01B 13/00* (2013.01); *C01B 19/02* (2013.01); *C01B 32/00* (2017.08);
(Continued)

(58) Field of Classification Search
CPC .......... G06N 1/00; C01B 32/00; C01B 13/00; C01B 19/02; C22C 5/04; C22C 27/04;
(Continued)

(56) References Cited

U.S. PATENT DOCUMENTS

| 10,318,880 B2 | 6/2019 | Pereverzev |
| 2003/0013275 A1 | 1/2003 | Burden |

(Continued)

OTHER PUBLICATIONS

Itoh et al., High purity isotopically enriched 29Si and 30Si single crystals: isotope separation, purification and growth Japanese Journal of Applied Physics, 2003, 6248-6251.*

(Continued)

*Primary Examiner* — Robert M Kunemund
(74) *Attorney, Agent, or Firm* — Zilka-Kotab, P.C.

(57) ABSTRACT

Materials, products, methods of use and fabrication thereof are disclosed. The materials are particularly well suited for application in products such as superconducting devices and quantum computing, due to ability to avoid undesirable effects from inherent noise and decoherence. The materials are formed from select isotopes having zero nuclear spin into a single crystal-phase film or layer of thickness depending on the desired application of the resulting device. The film/layer may be suspended or disposed on a substrate. The isotopes may be enriched from naturally-occurring sources of isotopically mixed elemental material(s). The single crystal is preferably essentially devoid of structural defects such as grain boundaries, inclusions, impurities and lattice vacancies.

9 Claims, 3 Drawing Sheets

300

302 — Enrich one or more elements to obtain a precursor material consisting essentially of one or more zero-nuclear spin isotopes of the one or more elements 304 — Form the precursor material into a layer having a thickness in a range from about 10 nm to about 10 um.

(51) Int. Cl.
H01L 39/24 (2006.01)
G01R 33/02 (2006.01)
C01B 19/02 (2006.01)
C01B 13/00 (2006.01)
C22C 27/04 (2006.01)
C22C 5/04 (2006.01)
H01L 39/12 (2006.01)
H01L 39/22 (2006.01)
C01B 32/00 (2017.01)
C30B 1/00 (2006.01)
C30B 7/00 (2006.01)
C30B 33/08 (2006.01)
C30B 33/04 (2006.01)

(52) U.S. Cl.
CPC .............. *C22C 5/04* (2013.01); *C22C 27/04* (2013.01); *C30B 1/00* (2013.01); *C30B 7/00* (2013.01); *C30B 7/005* (2013.01); *C30B 29/00* (2013.01); *C30B 33/04* (2013.01); *C30B 33/08* (2013.01); *G01R 33/02* (2013.01); *H01L 39/12* (2013.01); *H01L 39/223* (2013.01); *H01L 39/2493* (2013.01); *C01P 2006/40* (2013.01)

(58) Field of Classification Search
CPC .. C30B 1/00; C30B 7/00; C30B 29/00; C30B 33/04; C30B 33/08; G01R 33/02; H01L 39/12; H01L 39/223; H01L 39/2493; C01P 2006/40
See application file for complete search history.

(56) References Cited

U.S. PATENT DOCUMENTS

| | | | |
|---|---|---|---|
| 2003/0039865 | A1 | 2/2003 | Kelsey et al. |
| 2004/0004271 | A1 | 1/2004 | Fukuda et al. |
| 2016/0335559 | A1 | 11/2016 | Pereverzev |

OTHER PUBLICATIONS

Tsubouchi et al. "Epitaxial growth of pure 28Si thin films using isotopically purifed ion beams" Japanese Journal of Applied Physics, 2001 pp. 1283-1285.*

Azadegan et al., "Miniature High-Q Double-Spiral Slot-Line Resonator Filters," IEEE Transactions On Microwave Theory And Techniques, vol. 52, No. 5, 2004, pp. 1548-1557.

Burnett et al., "Evidence for interacting two-level systems from the 1/f noise of a superconducting resonator," Nature Communications, 2014, pp. 1-6.

Gao, T., "The Physics of Superconducting Microwave Resonators," California Institute of Technology, 2008, pp. 1-197.

Gesche et al., "Plasma ignition in a quarter-wavelength microwave slot resonator," Journal of Physics D: Applied Physics, vol. 41, 2008, pp. 1-4.

Hao et al., "Fabrication and Analogue Applications of NanoSQUIDs Using Dayem Bridge Junctions," IEEE Journal of Selected Topics In Quantum Electronics, vol. 21, No. 2, 2015, pp. 1-8.

Herrmannsdorfer et al., "How Nuclear Magnetism Impairs Superconductivity," Bulgarian Journal of Physics, vol. 27, No. 1, 2000, pp. 20-36.

Karthikeyan et al., "Slot split ring resonators and its applications in performance enhancement of microwave filter," IEEE, 2009, pp. 1-4.

Krupenin et al., "Aluminum Single Electron Transistors with Islands Isolated from the Substrate," Journal of Low Temperature Physics, vol. 118, No. 5-6, 2000, pp. 287-296.

Kumar et al., "Temperature dependence of the frequency and noise of superconducting coplanar waveguide resonators," Applied Physics Letters, vol. 92, 2008, pp. 123503/1-123503/3.

Laforest et al., "Flux noise in superconducting circuits: Electron versus nuclear spins," University of Victoria Department of Physics and Astronomy, 2015, pp. 1-9.

Lee et al., "Identification of the Local Sources of Paramagnetic Noise in Superconducting Qubit Devices Fabricated on a-Al2O3 Substrates Using Density-Functional Calculations," Physical Review Letters, vol. 112, 2014, pp. 017001/1-017001/5.

Li et al., "Low-frequency charge noise in suspended aluminum single-electron transistors," Applied Physics Letters, vol. 91, 2007, pp. 033107/1-033107/3.

Oliver et al., "Materials in superconducting quantum bits," MRS Bulletin, vol. 38, Oct. 2013, pp. 816-825.

Schroer et al., "Time to get the nukes out," Nature Physics, vol. 4, Jul. 2008, pp. 516-518.

Sendelbach et al., "Complex Inductance, Excess Noise, and Surface Magnetism in dc SQUIDs," Physical Review Letters, vol. 103, Sep. 2009, pp. 117001/1-117001/4.

Vasyukov et al., "A scanning superconducting quantum interference device with single electron spin sensitivity," Nature nanotechnology, vol. 8, Sep. 2013, pp. 639-644.

Wu et al., "Modeling Flux Noise in SQUIDs due to Hyperfine Interactions," Physical Review Letters, vol. 108, Jun. 2012, pp. 247001/1-247001/5.

Zhu et al., "Novel Spin Dynamics in a Josephson Junction," Physical Review Letters, vol. 92, No. 10, Mar. 2004, pp.

Pereverzev, S., U.S. Appl. No. 14/711,718, filed May 13, 2015.

Restriction Requirement from U.S. Appl. No. 14/711,718, dated Oct. 5, 2017.

Non-Final Office Action from U.S. Appl. No. 14/711,718, dated Mar. 8, 2018.

Tsubouchi et al., "Epitaxial Growth of Pure 28Si Thin Films Using Isotopically Purified Ion Beams," Japanese Journal of Applied Physics, vol. 40, 2001, pp. L1283-L1285.

Itoh et al., "High Purity Isotopically Enriched 29Si and 30si Single Crystals: Isotope Separation, Purification, and Growth," Japanese Journal of Applied Physics, vol. 42, 2003, pp. 6248-6251.

Final Office Action from U.S. Appl. No. 14/711,718, dated Oct. 2, 2018.

Notice of Allowance from U.S. Appl. No. 14/711,718, dated Feb. 26, 2019.

Fuhs et al., "A novel route to a polycrystalline silicon thin-film solar cell," Solar Energy, vol. 77, No. 6, Dec. 2004, pp. 961-968.

* cited by examiner

ULTRA LOW NOISE MATERIALS AND DEVICES FOR CRYOGENIC SUPERCONDUCTORS AND QUANTUM BITS

This application is a divisional of application Ser. No. 14/711,718 filed May 13, 2015, now U.S. Pat. No. 10,318,880.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates generally to materials useful for computational purposes, with particular practical applications in quantum computing and superconductor materials. More specifically, the present invention relates to providing solutions to undesirable effects associated with inherent noise and decoherence, including noise and decoherence caused by, e.g., two-level systems changing state, including changes in response to external electromagnetic noise, their interactions with each other inside the device and/or with device-generated electromagnetic fields, including Josephson oscillations in devices, etc.

BACKGROUND

The uncertainty principle is a well-known axiom of quantum mechanics, which in large part gave rise to the understanding of quantum objects (e.g. molecules, atoms, photons, spins, etc.) via a wavefunction or waveform that probabilistically describes a plurality of possible states the quantum object may occupy. States may describe characteristics such as position, direction, energetic state, etc.

The probabilistic description gives rise to the concept of quantum superposition, whereby it is presently understood that, in an isolated environment, any given quantum object capable of occupying more than one state is capable of occupying plural states simultaneously.

For example, an atom may simultaneously occupy an excited state and a ground state, or be simultaneously located in two different physical positions. However, as exemplified by the famous "Schodinger's cat" thought experiment, the act of observation effectively collapses the probability function such that the observer will only ever observe one of the plurality of possible states. Which particular state the probability function effectively collapses into during a particular observation event depends upon the probability function describing the quantum object.

Superposition has been experimentally verified by applying a coherent driving oscillating field (e.g. electromagnetic radiation) to a two-state quantum object which was in ground state at initiation, i.e. at moment t=0. Subsequently, a measurement was taken after time t to determine state of the object. Over time, many experiments as described above are performed. When the result is averaged and plotted according to observed state versus time, an oscillating curve between the two discrete states is revealed. This curve has become known as a "Rabi oscillation".

As delay t before making a measurement on a system increases, amplitude of oscillations is decreases, and eventually oscillations become non-observable; this effect is usually referred to as decoherence. Decoherence typically arises due to influence of forces other than those giving rise to the coherent quantum superposition. These "other forces" may be internal to the quantum object (e.g. nuclear spin within the quantum object) or external to the quantum object (e.g. interaction with another quantum object such as a photon or atom of a different type than the system of identical quantum objects, interactions with a surrounding environment, etc.). Decoherence occurs when a system interacts with its environment in a thermodynamically irreversible way. This prevents different elements in the quantum superposition of the total system's wavefunction from interfering with each other.

The practical consequence of decoherence is an apparent collapse of the probability function as the quantum nature of the system "leaks" into the environment. That is, components of the wavefunction acquire phase changes from interaction with their immediate surroundings. A total superposition of the global or universal wavefunction still exists (and remains coherent at the global level), but its ultimate fate remains an interpretational issue.

The superposition and decoherence phenomena have also been explored for systems of multiple, identical quantum objects. At initiation, all of the quantum objects simultaneously transition between the two discrete states, such that the corresponding Rabi oscillation curves are in phase. However, due to internal and/or external influence, individual quantum objects within the system of multiple quantum objects will spontaneously fall out of synchronization with the in-phase quantum objects. Over time if one performs measurements on a sample of objects to determine the state of each object, the result is that the Rabi Oscillations for the system as a whole appear as random noise rather than a coherent oscillating signal.

Decoherence remains a major challenge to very useful applications of quantum mechanics, for example in quantum computing. In this context, a quantum computer includes a plurality of quantum objects that are analogous to the "bits" of a classical transistor computer (also known as "qubits"). One significant advantage of quantum computing as compared to classical computing is the ability to leverage the quantum object's superposition to increase the computational power of the device. In brief, because qubits are probabilistic rather than discrete (as is the case for classical bits), a quantum bit can encode information in the form of both magnitude and direction of an n-dimensional vector (where n is the number of discrete states the qubit) whereas classical bits only encode information according to direction (magnetic bit orientation).

Accordingly, since decoherence causes the effective collapse of the probability function in a quantum computer, superpositioned qubits lose the computational advantage over classical bits upon experiencing decoherence. Thus, decoherence can be viewed as the loss of information from a system into the environment.

The precise reasons for this decoherence effects remain unknown, but generally point towards some causes that are responsible for athermal noise. Problematically, athermal noise can only be controlled to a certain extent by cooling. At a particular material-dependent temperature, further reduction in the temperature of the material does not produce a corresponding reduction in the athermal noise. It is believed that some atoms could have several closely-spaced equilibrium positions and can toggle between these positions. Another model assumes electron transitions between two close (in space and energy) states associated with defects or disorder. Yet another model assumes the existence of free spins associated with defects or dangling bonds on device surfaces, with spin re-orientation causing qubit decoherence or superconducting quantum interference device (SQUID) flux noise. See, for example, the discussion by Oliver and Welander ("Materials in superconducting quantum bits" *Materials Research Society Bulletin* 38:816-824 (2013)).

It is generally accepted that single-crystal substrates, as well as epitaxially-grown superconducting and dielectric films minimize the number of defects and hence the number of two-level systems and associated device noise. However, the exact microscopic origin and coupling mechanism are still a matter of ongoing debate. See, for example the discussion by Sendelbach, et. al. ("Complex Inductance, Excess Noise, and Surface Magnetism in dc SQUIDs," *Physical Review Letters;* 103:117001-4 (2009)).

Conventional approaches to avoiding decoherence in quantum computing and other similar systems leveraging superposition of quantum objects to practical advantage have generally approached problem by attempting to isolate the system from external influence, such as thermal radiation and external quantum objects that tend to interfere with the quantum objects and cause decoherence as noted above. For example, many of the world's most sensitive devices operate at ultra-low temperatures where thermal noise is reduced and electronic phase coherence is increased. Still, even in the best superconducting qubit devices, the coherence time is currently insufficient to apply quantum error correction algorithms and thus to build an actual quantum computer.

In addition, many large computing centers and systems have recognized that current architectures are approaching a limit in the sense that advancing computational power beyond the next generation of systems will require unprecedented power supply. The power problem is of such scale that it is presently estimated that a nuclear power plant or equivalent energy source would be necessary to accomplish the desired increase in computational power of the next-generation supercomputer or large super-server.

One solution to this power problem is to use quantum computers. However, it is also believed that power consumption may be significantly reduced using classical computing architectures, but this result is dependent upon reducing the noise inherent to elements of the classical computer. Noise resulting from external and internal sources can be reduced by using physically isolated superconductors cooled to cryogenic temperatures (e.g. less than about 4 Kelvin).

In practice, the power required to keep superconducting computers cold and to perform a large volume of computations appears to be smaller than power required to run similar computations using room-temperature computer. However, due to athermal noise, cooling below a certain temperature does not result in lower noise, and makes it impossible to further decrease the amount of power required for large volume computations.

Accordingly, it would be beneficial to provide materials and systems with sufficiently low inherent noise and decoherence to accomplish quantum computing and/or classical superconductor elements such as microwave resonators, superconducting quantum interference devices (SQUIDs), etc. capable of operating as a superconducting computer while significantly reducing power consumption and/or cooling requirements exhibited by existing superconducting computer elements.

SUMMARY

In one embodiment, a product includes one or more isotopes exhibiting substantially zero nuclear spin. The isotope(s) are formed into a single crystal consisting essentially of a single crystalline phase.

In another embodiment, a method includes enriching one or more elements to obtain a precursor material consisting essentially of one or more zero-nuclear spin isotopes of the one or more elements; and forming the precursor material into a layer having a thickness in a range from about 0.3 nm (nanometer) to about 10 um (micron).

Other aspects and embodiments of the present invention will become apparent from the following detailed description, which, when taken in conjunction with the drawings, illustrate by way of example the principles of the invention.

BRIEF DESCRIPTION OF THE DRAWINGS

FIGS. 2D-2E depict a layer as shown in FIG. 2B and/or 2C, formed into a resonator, according to various embodiments. The resonators are shown from a top view, and may optionally include a thin protective film (not shown) deposited on one or more surfaces of the resonator. FIG. 2D depicts a slot configuration, while FIG. 2E depicts a double spiral configuration, according to alternative embodiments.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Similarly, the terms "substantially pure," "substantially devoid", "substantially single" etc. are all to be understood as referring to a characteristic that is at least 99% present for the particular embodiment being described. Thus a substantially pure material would include at least 99% of the material, and no more than 1% of any composition other than the "pure" formulation recited. Similarly a material that is substantially devoid of a particular feature includes no more than 1% of that feature. The measure may be with respect to volume, mass, count, or other suitable unit of measure that will be appreciated by a person having ordinary skill in the art upon reading the present descriptions.

The following disclosures present inventive concepts by way of illustration, description, and explanation with reference to quantum objects and "two-level" systems. The commonly-envisioned two-level system is a quantum object such as a single atom which is capable of occupying or exhibiting two distinct states, typically two energy states such as "ground/relaxed" and "high/excited". It should be understood that, while the descriptions are made primarily with reference to the common energy state model of a two-level system, the inventive concepts presented herein are equally applicable to systems where the two levels do not correspond to energy states (e.g. instead corresponding to positional state) and/or where the system is capable of exhibiting or occupying more than two distinct states.

Figure 1A:
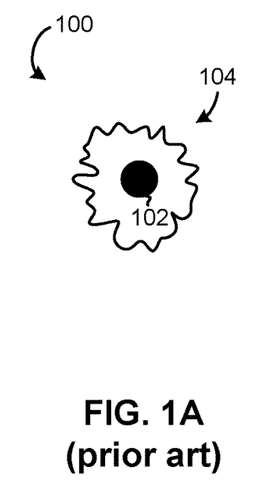
FIGS. 1A and 1B illustrate an exemplary two-level system, as known in the art.
Figure 1B:
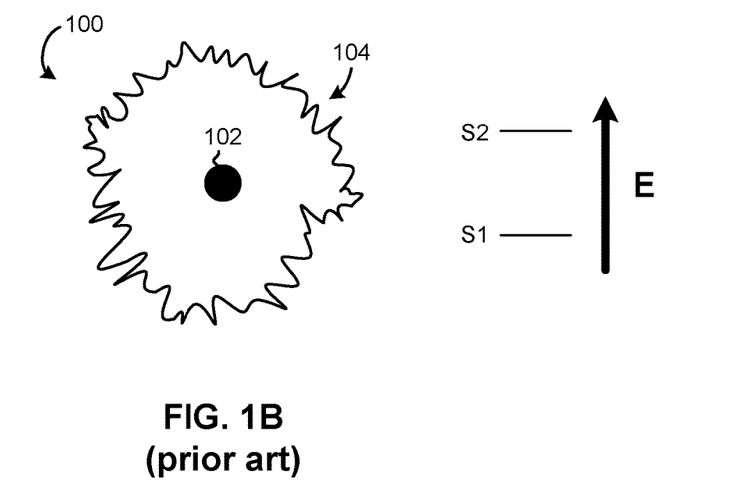

An exemplary two-level system is depicted graphically in FIGS. 1A-1B, which includes a quantum object 100 such as an atom, a spin, a molecule, a photon, etc. as would be understood by a person having ordinary skill in the art. For sake of simple discussion, the discussion will assume quantum object 100 is an atom having a nucleus 102 and at least one electron in an orbital 104. In FIG. 1A, the atom is in a "ground" or "relaxed" state S1, and the electron is correspondingly occupying a stable, relatively low-energy orbital 104. In FIG. 1B, for example due to absorbance of energy from an incident photon, the atom is in an "excited" state S2 and accordingly the electron occupies a relatively high-energy orbital 104. Due to natural processes, e.g. emission of a photon, the atom may return to the relaxed or ground state shown in FIG. 1A. In practice, as discussed above, the isolated quantum object exists in a superposition between these two energy states S1 and S2 unless and until decoherence occurs.

Accordingly, as referred-to herein, a "two-level system" should be envisioned as encompassing any type of quantum object or system which is capable of exhibiting more than one distinct state, and transitions from one state to another in accordance with the principles of quantum mechanics.

Embodiments described herein provide materials and systems suitable for quantum electronics and superconducting applications, as well as methods of fabrication and use thereof.

The potential benefits of quantum-based computing and sensing have been investigated by many research groups over the last few decades. Currently, numerous groups are developing superconducting bolometers with very high energy resolution or energy sensitivity, many groups are working on SQUIDs magnetic flux sensors, which in particular are in use to readout superconducting bolometers, and many other groups are creating quantum bits (qubits) which can be used for computing applications; so there is also rising interest in development of superconducting computers. However, none of the existing efforts have addressed the inherent noise and decoherence problems discussed herein.

However, a significant factor limiting the performance of these devices is decoherence and noise inherent in the operation of the devices. The noises found in qubits, "regular" superconducting computers, SQUIDS, and other cryogenic devices have many similar features. Accordingly, since, the materials and technologies used to make these devises are similar, it is suspected that the noise issues in the different devices can be traced to a common, materials-related origin. Essentially, the noise seems to be due to the unavoidable excitation of low lying energy states in the material, oftentimes referred to as two-level systems.

While numerous experiments have been done which support this conclusion, the microscopic origin of the two-level system responsible for generating this noise has not been identified. This is unfortunate because as long as there is no clear idea of what is causing the noise, it will be difficult to effectively reduce the noise levels. Thus, to date, most approaches to building low noise qubits have focused on designs which have stable operation against fluctuations and readouts which interact less with the qubit and with two-level systems in qubit material (such as parametric readout of qubits using a superconducting resonator). The present application suggests a substantially similar approach can be taken to improve SQUIDs.

Strong, high frequency Josephson radiation of standard DC SQUIDs produces back-action and self-back-action by coupling to low-lying excitations in materials. This can be avoided with dispersive SQUID readout (e.g. by measuring effective inductance or resonance frequency with current below critical, rather than measuring critical current itself, by modulating current through the SQUID above critical). Such devices are especially useful for the field because, in addition to improving sensitivity in many fundamental experiments, it can be used to facilitate material research by the most direct probing low-lying excitations.

Superconducting quantum bits have been under development for some time, and the field exhibits a variant of "Moore's Law" regarding transistors on a chip, such that coherence time for superconducting resonators and/or qubits generally has doubled each year for approximately the past five years. Oliver, et. al. note that > although several mechanisms are known to exist (e.g., coupling to microscopic defects), their origin is not well understood. Mitigating these types of decoherence mechanisms ultimately boils down to two general approaches: (1) reduce the qubit's sensitivity to a given type of noise through design modifications; and (2) identify and reduce the sources of that noise through materials and fabrication improvements. In practice, the coherence improvements over the past decade were made through a combination of improved designs, improved fabrication, and improved materials. From this perspective, there remains an important role for materials and fabrication research in order to further improve qubit coherence times.

However, the presently disclosed inventive concepts extend beyond those known mechanisms and address the existence of a problem not previously known to exist. In particular, no previous efforts have taken into consideration the impact of nuclear electric quadrupole moments, as their role in contributing to decoherence and intrinsic noise have yet to be investigated. Accordingly, there has not previously been any suggestion of a reason to attempt fabricating superconducting resonators and/or qubits specifically taking into account electric quadrupole moments, because previous to the present disclosures the impact thereof on superconducting qubit performance was not appreciated. More specifically, the impact of nuclear electric quadrupole moments on noise and coherence time in qubits has not been considered.

Similarly, as described in detail by Herrmannsdorfer, et al., the impact of nuclear magnetic ordering on superconductivity is well documented. However, with respect to qubits, the influence of nuclear magnetic ordering has not been previously appreciated, and thus remains uninvestigated to-date. Accordingly, there has not previously been any suggestion of a reason to attempt fabricating superconducting resonators and/or qubits specifically taking into account nuclear magnetic ordering, because previous to the present disclosures the impact thereof on qubit performance was not appreciated. More specifically, the combined impact of nuclear electric quadrupole moments and nuclear magnetic ordering on noise and coherence time in qubits and on ultimate noise of superconducting devices such as SQUIDs and highly sensitive device such as single-electron transistors has not been considered.

Thus, in one general embodiment, the presently disclosed inventive concepts include a material comprising one or more isotopes exhibiting substantially zero nuclear spin. The isotope(s) are formed into a single crystal consisting essentially of a single crystalline phase.

In another general embodiment, a method includes enriching one or more elements to obtain a precursor material consisting essentially of one or more zero-nuclear spin isotopes of the one or more elements; and forming the precursor material into a layer having a thickness in a range from about 10 nm to about 10 um. As hinted above, the role of nuclear and localized electron magnetic moments in contributing to noise and decoherence is an important but previously unappreciated effect. Accordingly, the presently disclosed inventive concepts relate to how these problems arise, and how such problems can be effectively addressed.

In general, two-level systems can have "translational" and "rotational" transitions. Translational transitions could include ions or electrons "hopping" between two closely spaced states, and "rotational" transitions could include electron or nuclear spins changing orientation. Interactions between the two-level systems are also important. In order to mitigate two-level system noise, a number of approaches can be taken.

For instance, noise arising from "translational" transitions can be targeted by avoiding the creation of thin, glass-like films on substrates, such as tunnel barriers, limiting/eliminating oxide films on metal surfaces, and by using epitaxially grown metal and barrier films. However, certain specific features observed for glasses (such as long, glass-like relaxation times and "voltage memory effect") have never been observed in qubits.

Without wishing to be bound to any particular theory, the inventors believe an overlooked potential source of two-level systems is the large number of very low-energy states associated with the nuclear orientations of a substrate material upon which superconducting resonators and/or qubits are fabricated/positioned, as well as nuclear orientations and low-energy states of nuclei of atoms of the superconductor itself.

Popular substrate materials for fabricating qubits and superconducting resonators are Sapphire ($Al_2O_3$), Niobium (Nb) and Aluminum (Al). All nuclei in stable isotopes of Nb or Al have non-zero spins and hence are potential sources of two-level system noise. Indeed, Nb has one of the largest known magnitude nuclear magnetic moments.

Moreover, when nuclei with electric quadrupole moments are present in the material, electric field gradients (internally and externally generated) can also play a role in contributing to the two-level system noise. In addition, it is theorized that these quadrupole interactions become enhanced in regions where high local electric field and field gradient are present, such as at surfaces, interfaces and lattice defect sites, including those in epitaxial layers, and, moreover, inevitable in hetero-epitaxial layers.

The fact that the most common materials employed for superconducting resonators and qubits exhibit nuclear spin and electric quadrupole moments presents a unique challenge to the previously unappreciated problem of reducing decoherence by taking into account nuclear ordering and electric quadrupole moments. Namely, since all stable isotopes of the most common constituents have nuclear spin, it would have been exceedingly difficult if not impossible to appreciate the impact of nuclear spin because there would not be an opportunity to observe the performance of a qubit lacking such nuclear spin.

Nuclear Quadrupole Resonance (NQR) frequencies are usually in a range from about 1 MHz-100 MHz, while for piezo- or ferro-electric materials it can be in the 1-100 GHz scale. On the other hand, strong local internal electric field and field gradients can exist not only in piezo- and ferro-electric materials, but in any crystalline material, particularly around lattice defect. This phenomenon is known as the giant flexo-electric effect. Again, no special crystallographic lattice symmetry is required to get undesirably strong enhancement of local electric field or field gradient around such defects. Thus, it is possible for nuclei around defect sites to achieve NQR frequency in resonance with a superconducting microwave resonator or in a range corresponding to qubit operational frequency.

It is also accepted that existence of a small number, e.g. two-level systems with transition energies in resonance with an operational frequency of the device in which the small number of two-level systems exist is sufficient to cause observed decoherence/noise effects. Accordingly, the presently disclosed inventive concepts provide the benefit of avoiding such decoherence and noise effects by carefully controlling device composition and structure.

For instance, a number of theoretical treatments of two-level system generated noise include interactions between the two-level systems. When considering nuclear spin-based two-level systems, interactions between nuclear spins may lead to nuclear magnetic ordering. This magnetic ordering effect will lead, in turn, to correlated spin flips involving a large number of nuclei, effectively enhancing the magnitude of the noise to levels consistent with what is observed in experiments. For example, co-existence of nuclear ferromagnetism and superconductivity was demonstrated by Hermannsdörfer, et. al.

Magnetic order fluctuations disadvantageously result in magnetic flux noise, charge noise, and kinetic inductance noise. Moreover, these fluctuations are correlated, due to changes of electrons chemical potential inside the nuclear ordered cluster (e.g. a metal grain within a bulk material).

In addition, the frequency at which an individual two-level systems will resonate can be affected by its local environment, such as by a strong local electric field or field gradient. Thus, a natural mechanism which would lead to interacting two-level systems would be due to a (e.g. nuclear) quadrupole moment re-orientation and/or lattice deformations. Interactions between the nuclei suggests the possibility of "tuning" the quadrupole resonance of particular nucleus (e.g. near a structural defect in a crystal) by changing orientation of the nuclei more distant from the defects and thus having softer orientation energies. This also implies a hierarchy of nuclear orientation energies and spin-glass behavior within the crystal.

Direct "spectroscopy" of individual nuclear spins and even large clusters is not yet possible, making direct experimental observation of this effect difficult. However, an indirect approach can be taken by fabricating a device using materials having nuclei with zero nuclear spin. For zero-spin isotopes, the nuclear dipole magnetic and nuclear quadrupole electric moments are zero, and thus all nuclear orientation effects are absent. This is significant, because it suggests that two-level system noise can be greatly reduced by fabricating devices using materials having nuclei with zero spin. And while such isotopically pure materials are critical for low-noise device operation, the absence of nuclear spins seems to be a necessary condition (especially for lowest temperatures), but not a sufficient condition for suppressing noise and decoherence to levels necessary to achieve quantum computing applications.

Thus, in order to further reduce the noise inherent to these devices, the methods previously used to grow the materials have to be investigated and improved. For example, improvements must be made to fabrication techniques such as described by Vasyukov, et al. ("A scanning superconducting quantum interference device with single electron spin sensitivity" *Nature Nanotechnology*, 8:639-644 (2013)) and Hao, et al. ("Fabrication and Analogue Applications of NanoSQUIDs using Dayem Bridge Junctions" *IEEE Journal of Selected Topics in Quantum Electronics;* 21(2): 9100108 (2015)).

More specifically, conventional fabrication techniques such as described in the above references produce metal films observed to have grainy structures, which is largely due to the methods employed in the growth of the films. Because the number of free spins depends on substrate preparation and film deposition technologies, the resulting conventional materials that vary with degree of crystallinity, crystallite size, crystallite orientation, existence of grain structures and grain boundaries, impurities on grain boundaries, substrate surface conditions, etc., and characteristically exhibit undesirable free spin in the resulting product.

Fluctuating electron magnetic moments result in fluctuating magnetic flux noise, and thus it is thought that 'free' spins on the surface are also responsible for the noise. Single spin or spin clusters (magnetic cluster) can interact with currents in the device and thus can be excited by the operation of the device, even when powered at very low levels. Apparently, as a result complex dynamics will lead to noise and decoherence. Without wishing to be bound to any particular theory, the inventors believed that these "free" spins are supposedly due to localized electron states on metal surfaces, on dielectric surfaces (broken chemical bonds), metal-dielectric interfaces (states "induced" in dielectric), some or all of which should therefore preferably be avoided.

As opposed to conventional fabrication techniques, epitaxially grown films have a much 'smoother' grain structure, with a better defined orientation. Thus, epitaxially grown materials help to reduce the two-level system noise affecting device operation, but remaining grain boundaries, metal-substrate interface(s) and "free" metal surface(s), as well as presence of oxide(s) or patina(s) on the resulting product are still problematic.

One potential experimental approach to measuring an upper bound on surface spin concentration has been developed as part of this effort. The upper bound on surface spin concentration can be found by measuring induced macroscopic magnetic moment of a stack of thin samples with magnetometer. This approach can be done using dielectric substrate materials (such as sapphire) or with thin metal films deposited on top of dielectric substrates. In metal films (foils) superconductivity can be suppressed by the field for this test. This approach should be sensitive enough to place upper bounds on any macroscopic magnetic moment. However, in order to push the field further, we believe single electron spins can be potentially detected with better SQUIDs using the methods discussed below.

Accordingly, to further suppress noise and decoherence, the presently disclosed inventive concepts are directed to substrate-free, single-crystal, zero-nuclear-spin materials, devices, and methods of manufacture and use thereof.

Materials

Generally speaking, the presently disclosed inventive systems are constructed from materials which have stable zero nuclear spin isotopes, such as W, Mo, Pd, Tl, Pt, Si, In, Pb, Sn, Zn. Particularly preferred among the above species are isotopes having a substantially spherical nucleus such that changes in nuclear magnetic dipole moment orientation and gradients generated by nuclear electric quadrupole moments minimally contribute to resulting noise, such as one or more of the following isotopes: $^{12}C$ (including compositions such as graphene), $^{14}N$, $^{15}N$, $^{28}Si$, $^{30}Si$, $^{46}Ti$, $^{48}Ti$, $^{50}Ti$, $^{64}Zn$, $^{66}Zn$, $^{68}Zn$, $^{70}Zn$, $^{70}Ge$, $^{72}Ge$, $^{74}Ge$, $^{76}Ge$, $^{92}Mo$, $^{94}Mo$, $^{96}Mo$, $^{98}Mo$, $^{100}Mo$, $^{102}Pd$, $^{104}Pd$, $^{106}Pd$, $^{108}Pd$, $^{110}Pd$, $^{123}Te$, $^{128}Te$, $^{180}W$, $^{182}W$, $^{184}W$, $^{186}W$, $^{190}Pt$, $^{192}Pt$, $^{194}Pt$, $^{196}Pt$, $^{198}Pt$, $^{204}Pb$, $^{206}Pb$, and $^{204}Pb$. Of course, as would be understood by those having ordinary skill in the art upon reading the present descriptions, other similar isotopes of various materials may be employed without departing from the scope of the present disclosures, so long as those isotopes satisfy the criteria of exhibiting "zero nuclear spin" as set forth herein.

In preferred approaches, the materials disclosed herein comprise one or more of the above isotopes of Pt, Si, Pd, W, Mo and Te. Particularly preferable are alloys of PdSi, WSi, MoSi, PtSi and PdTe, formed from the above isotopes, due to advantageous superconducting critical temperatures (approximately 0.94 Kelvin for PdSi, 0.8 Kelvin for PtSi, and approximately 4.0 Kelvin for PdTe). Most preferable are PdTe alloys or materials containing Mo, since both Pd and Te, as well as Mo are resistant to oxide formation. Moreover, $PdTe_2$ alloy is preferred due to the fact that single crystals can be grown directly from a melt of stereometric composition.

Importantly, the alloying process should be performed in a manner so as to not generate sources of inherent noise in the material, e.g. surface defects, lattice vacancies, grain boundaries, etc. as described herein. For example, in a thesis by Jiansong Gao "The Physics of Superconducting Microwave Resonators," California Institute of Technology (2008), it is suggested to use PtSi in a superconducting microwave resonator. However, these materials are formed by Pt ion implantation into a Si substrate, which will produce significant defects within the resulting product, said defects tending to generate inherent noise in an undesirable manner.

The following isotopes, on the other hand, are undesirable for inclusion in materials as described herein. $^{13}C$, $^{17}O$, $^{27}Al$, $^{29}Si$, $^{47}Ti$, $^{49}Ti$, $^{67}Zn$, $^{73}Ge$, $^{93}Nb$, $^{95}Mo$, $^{97}Mo$, $^{105}Pd$, $^{113}In$, $^{115}In$, $^{115}Sn$, $^{117}Sn$, $^{119}Sn$, $^{124}Te$, $^{126}Te$, $^{128}Te$, $^{130}Te$, $^{183}W$ $^{195}$Pt, $^{197}$Au, and $^{208}$Pb. These isotopes are undesirable because the isotope have an undesirable spin etc. as would be understood by a person having ordinary skill in the art upon reading the present descriptions.

As will be further understood by a person having ordinary skill in the art, naturally occurring sources of elemental materials exist as a mixture of isotopes of those elements. Accordingly, care should be taken to isolate only those isotopes listed above as suitable zero-nuclear spin isotopes from naturally occurring sources of the elements disclosed. Clean (99%) zero nuclear spin isotopes may be purified/enriched from commercially available sources of the above materials using known techniques, but these techniques have not been previously applied to form superconducting materials and/or qubits. Without wishing to be bound to any particular theory, the inventors believe this is because the benefit of doing so was not previously appreciated due to failure to appreciate the problems caused by inherent noise arising from changes in nuclear spin orientation and/or nuclear electric quadrupole effects.

System Fabrication Techniques

In general, zero nuclear spin material(s) are provided in the form of a precursor (e.g. a nanopowder) or enriched from natural sources, and the precursor is formed into a thin film or a single crystalline-phase bulk material using known techniques.

Figure 2A:
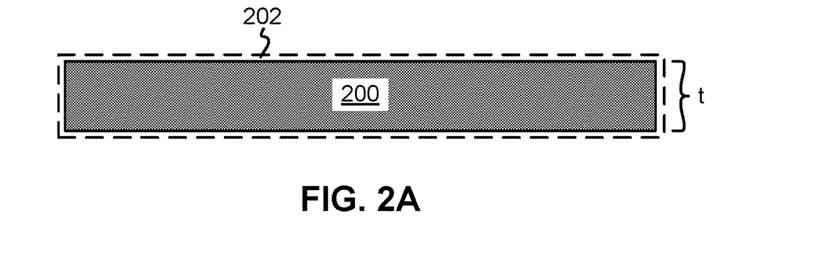
FIG. 2A depicts one exemplary embodiment of a zero-nuclear spin superconducting material formed into a layer having a thickness t. The layer is shown from a side view and may optionally include a thin protective film deposited on one or more surfaces of the layer.

Making large single crystals and thin single crystal layers (e.g. layer 200 as shown in FIG. 2A) is a well-established technology. Any suitable technique for making a materials disclosed herein in the form of a layer 200 may be employed without departing from the scope of the present disclosures. The layer 200 is preferably either a thin film (which may or may not be mechanically self-supporting, in various approaches) such as thin films 210, 220 shown in FIGS. 2B-2C, or a bulk single-crystal which may be subsequently formed into the layer 200 such as shown in FIG. 2A. In either case, the layer 200 is characterized by a thickness t, which for bulk single-crystal embodiments is preferably in a range from about 0.1 um to about 100 um, while for thin-film embodiments t is preferably in a range from about 0.3 nm to about 1 um.

Figure 2B:
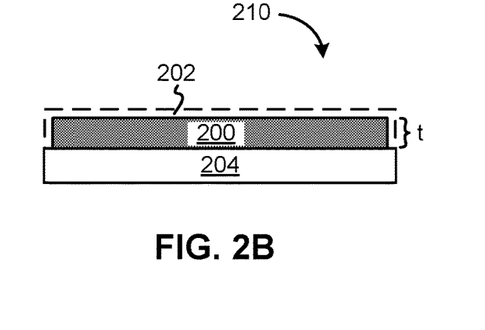
FIG. 2B depicts a layer as shown in FIG. 2A, configured as a thin film having a thickness t, the layer being deposited on a substantially planar substrate, in accordance with one exemplary embodiment. The layer is shown from a side view and may optionally include a thin protective film deposited on one or more surfaces of the layer.
Figure 2C:
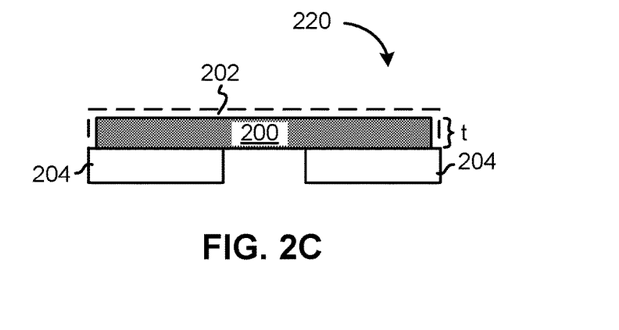
FIG. 2C depicts a layer as shown in FIG. 2A, configured as a thin film having a thickness t, the layer being deposited on a substrate comprising a plurality of support pillars selectively placed in non-noise sensitive areas of the layer, in accordance with another exemplary embodiment. The layer is shown from a side view and may optionally include a thin protective film deposited on one or more surfaces of the layer.

Thin film embodiments such as shown in FIGS. 2B-2C are preferably formed by deposition of the material on a substrate 204, which may be a dielectric material such as a silicon substrate. In alternative approaches, the substrate 204 may be coupled to one surface (e.g. a lower plane) of the thin film 200, such as shown in FIG. 2B, or may be in the form of one or more supporting pillars/regions 204, such as shown in FIG. 2C. Advantageous, the supporting pillars/regions 204 may be positioned at or near non-noise sensitive portions of the device formed from the thin film 200 to minimize any noise contribution from interactions between the substrate 204 and the material of the thin film 200.

Figure 2D:
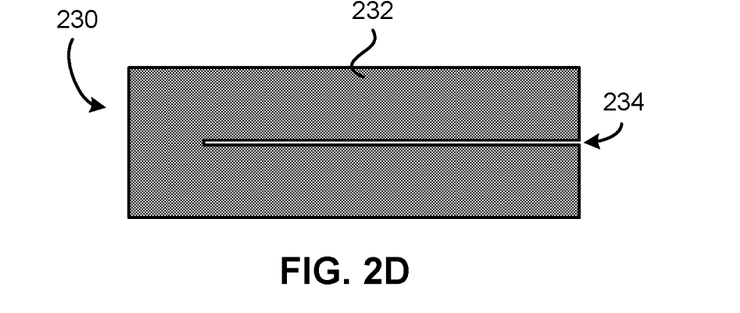
Figure 2E:
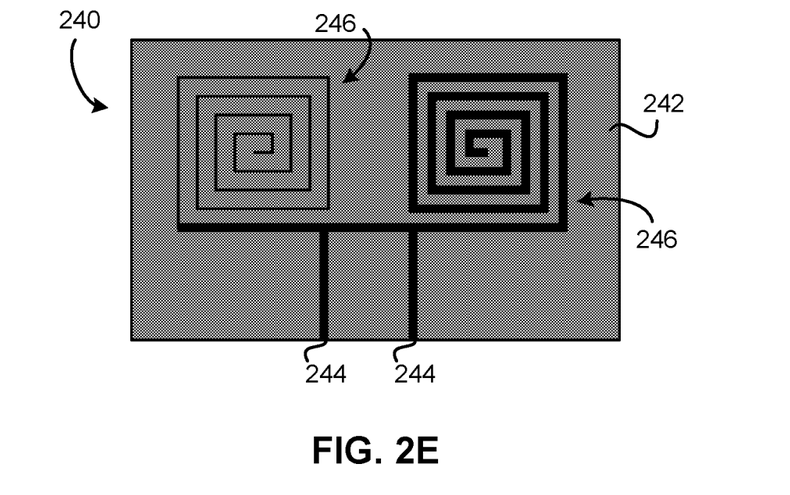

In one approach, it is advantageous to form slot-line resonator devices, examples of which include coplanar waveguide resonators having a configuration such as shown in FIG. 2D, slot-line resonator filters having a configuration such as shown in FIG. 2E, etc. as would be understood by a person having ordinary skill in the art upon reading the present descriptions. Preferably, such devices can be fabricated by forming a thin film of a zero-nuclear spin material as described herein, optionally on a substrate such as a dielectric material, and forming one or more slots in the thin film, e.g. via a lithography or ion milling technique.

With continuing reference to FIGS. 2D and 2E, in one approach a coplanar waveguide resonator 230 such as a microwave resonator is formed from a zero nuclear spin material as described herein. The formation preferably includes depositing the material as a thin film 232, e.g. on a dielectric substrate, and forming one or more slots (e.g. slot 234 as shown in FIG. 2D) in the material.

The slots may have any suitable geometry, and preferably exhibit a geometry known to convey particular advantages in particular applications (e.g. a straight, linear slot for a coplanar waveguide, opposing spiral configuration for capacitive coupling, etc. as would be understood by a person having ordinary skill in the art upon reading the present descriptions).

For example, as shown in FIG. 2E, an exemplary slot-line dual-spiral resonator filter 240 is shown, according to one embodiment. The filter 240 includes a plurality of slot lines 244, 246 formed in the material 242, e.g. via an ion milling or lithography technique. The slot lines may include lead slot lines 244 which lead to the resonator/filter slot lines 246, which are arranged in a substantially spiral pattern.

Making SQUIDs and other superconducting devices by lithography and/or ion milling is well-documented and may be employed without limitation to form devices out of the materials disclosed herein using any suitable technique known by those having ordinary skill in the art.

Figure 3:
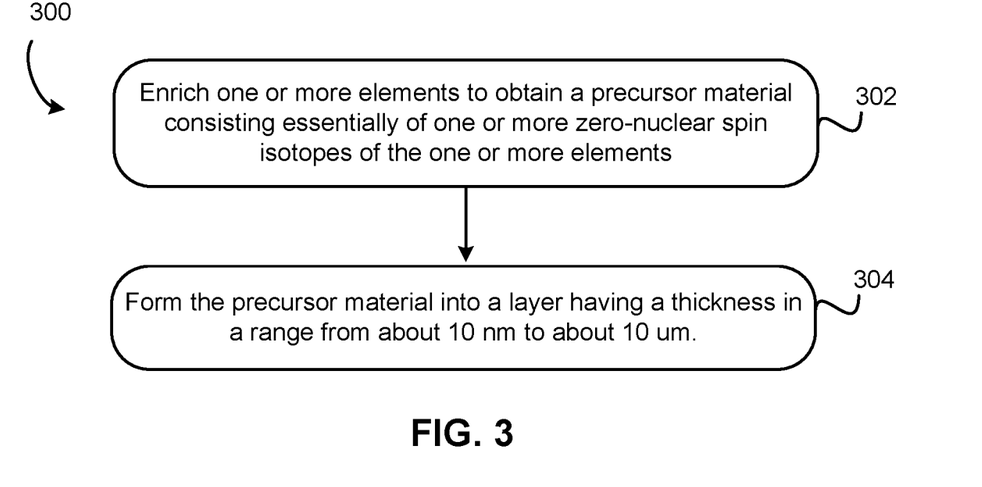
FIG. 3 is a flowchart of a method, according to one embodiment.

However, the inventive superconducting devices (e.g. resonators and/or qubits) disclosed herein are preferably fabricated substantially according to a method 300, as shown in FIG. 3.

As will become clear from reading the present descriptions, a significant distinction between prior art fabrication techniques and materials from the presently disclosed materials and techniques exists in the form of carefully preparing precursor material and employing a crystal formation process that yields specific structural and physical characteristics in the final product (i.e. zero nuclear spin, single-crystal bulk phase substantially free of defects such as grain boundaries, inclusions, impurities, vacancies, etc. as described herein. The material preparation and crystal formation considerations suggested in these disclosures address a problem previously unappreciated in the art, as will be described in further detail below.

In one embodiment, method 300 includes operations 302 and 304. In operation 302, a zero-nuclear spin material is enriched from one or more naturally-occurring material(s) to a purity of about 99% or more. The enrichment may be performed using any suitable technique known in the art, and essentially includes isolating different isotopes of the naturally-occurring material and enriching those stable isotope(s) that have a substantially spherical nucleus from isotopes with less spherical nuclei. For example, in one approach atomic vapor laser isotope separation (AVLIS) may be employed to enrich the zero-nuclear spin material from the naturally occurring material and obtain a "clean" or "isotopically pure" (e.g. 99 wt. %) preparation of zero-nuclear spin material.

Importantly, while several materials disclosed herein have been employed as a composition for superconducting elements, quantum bits, etc. in previous endeavors, no such use of these compositions has specifically employed an isotopically-pure zero-nuclear-spin material as suggested herein. Nor have any previous efforts specifically focused on using single-crystal materials, instead utilizing polycrystalline embodiments of these compositions.

Without wishing to be bound to any particular theory, the inventors theorize a significant reason for this historical pattern is a lack of appreciation of the reasons why a zero-nuclear spin material would provide substantial benefits with respect to the noise inherent to materials arising out of quantum effects, particularly nuclear magnetic dipole moments and nuclear electric quadrupole moments as discussed above.

In addition, previous efforts have focused primarily on forming quantum bits, resonators, SQUIDs, single-electron transistors, etc. from polycrystalline aluminum (Al) and/or niobium (Nb). However, these materials were not enriched for zero-nuclear spin isotopes, include polycrystalline structure, surface and lattice defects, etc., and are prone to forming oxides, a particularly disadvantageous characteristic for systems and materials within the scope of the present disclosures.

Accordingly, without any appreciation of the problematic impact of this inherent noise, there has previously been no reason to specifically approach problems faced in applications such as quantum computing, single electron detection using single electron transistors, single-photon IR detectors (mid and far-range), etc. The theories presented herein, however, suggest that limitations which have to-date frustrated the ability to accomplish a working quantum computer, detect single electron magnetic moment (spin) with SQUIDs, count single electrons with single-electron transistors, etc. may be overcome by suppressing, and preferably eliminating noise contribution arising from previously unconsidered sources—nuclear magnetic dipole moments and nuclear electric quadrupole moments which are believed to contribute to noise and reduce the decoherence time exhibited by a particular material.

Figure 2F:
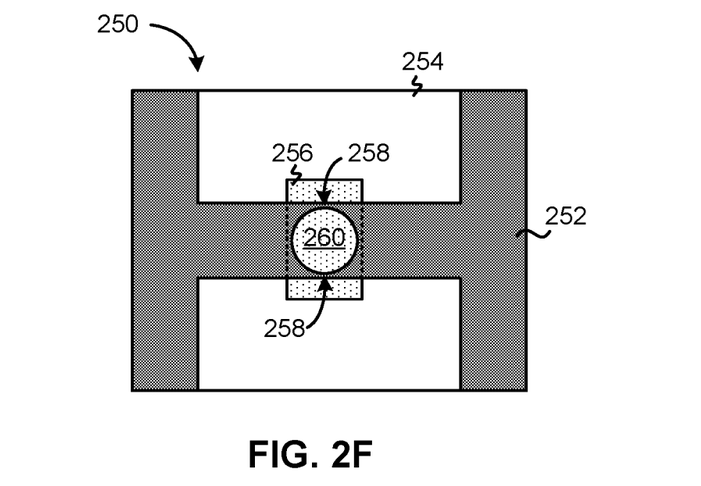
FIG. 2F depicts a layer as shown in FIG. 2A, formed into plurality of superconducting quantum interference device (SQUID) probes configured as a bridge, according to one embodiment. The SQUID probes are shown from a top view, and may optionally include a thin protective film (not shown), in various approaches.

In operation 304, the precursor material is formed into a layer having a predetermined thickness t in a range from several micrometers (e.g. 0.3 nm-1 um for thin film applications, e.g. where the resulting device may be attached to a dielectric substrate such as shown in FIGS. 2B-2C, or suspended above small opening in dielectric substrate, such as opening 260 shown in FIG. 2F) to several microns (e.g. 1-100 microns for applications where large mechanically self-supporting structures are desired) using techniques such as ion milling and/or lithographic processes.

In alternative approaches, the forming comprises either epitaxially growing the crystalline layer to form a thin film on a substrate, wherein the thin film is characterized by a thickness in a range from about 0.3 nm to about 1.0 um, or growing a bulk crystal from the precursor material, wherein the bulk crystal excludes one or more of: grain boundaries; inclusions; impurities; and crystalline lattice vacancies.

Accordingly, the crystal is a single crystal preferably having a uniform, unitary crystalline phase substantially free of defects such as surface defects, inclusions, grain boundaries impurities, inclusions, and lattice vacancies.

Optionally, the layer 200 may be coated with a protective film 202 consisting of zero nuclear spin material which does not form oxides or patinas in an oxygen environment (e.g. due to short, accidental contact with air). For example a preferred embodiment includes a layer consisting of a single crystal PtSi alloy (having no defects, inclusions, etc. as discussed above) coated with a thin film of a zero-nuclear spin material, e.g. to a thickness of about 0.1-10 nm in various approaches. Most preferably are embodiments where a Pt film of thickness less than about 10 nm is covering the surface of a single-phase bulk crystal consisting of PtSi.

After growth and/or formation, the crystal or layer may be affixed to a substrate such as a dielectric, the substrate optionally having a pre-etched support structure. The layered material may be subsequently cut, e.g. using lithography or ion milling techniques. In other embodiments, a self-supporting structure may be formed from the crystal or layer, and suspended without being affixed to a substrate.

In more embodiments, multi-element systems can be "carved" out single crystal layer with galvanic, capacitive and/or inductive coupling in between components, in a way that "noise-critical components" remain mechanically self-supported or supported by a perimeter of dielectric structures (such as pillars 204 shown in FIG. 2C) or in a "noise non-sensitive" location.

Accordingly, in some approaches a plurality of superconducting devices such as nanoSQUIDs may be formed from the materials disclosed into a bulk single crystal and subsequently thinned into a layer having a predetermined thickness. The layer may be formed by any suitable technique, and subsequent to formation may be affixed to a substrate as discussed above and formed into a functional device such as bridge 250 shown in FIG. 2F. The bridge 250 may be any suitable type of bridge, and includes the material 252 deposited/formed on a substrate 254 as discussed above. The material 252 may be milled or otherwise removed from the substrate 254 using any suitable technique, according to a predefined pattern in order to produce a device having a predetermined geometry. In the case of bridge 250, the geometry substantially represents a capital letter "H" when viewed from a top view, with a hole in horizontal bar, and this hole forms two "micro-bridges" 258 which serve as Josephson contacts. An interior portion of the cross-bar is suspended above an opening 256 in the substrate 254. The suspended configuration advantageously isolates the material 252 from the substrate 252 in areas where the device is sensitive to noise, such as near micro-bridge(s) 258 of a SQUID loop 260. The bridge 250 may serve as a connection between other superconducting devices, and may be coupled thereto galvanically, inductively and/or capacitively, in various embodiments. Preferably, each bridge 250 in a superconducting device utilizing materials as disclosed herein has a sizes of "micro-bridges" 258 are approximately equal to a healing length of the material 252. As understood herein, a "healing length" is a distance at which a density of superconducting electrons reaches a bulk value, when traveling from a region where electron density was suppressed.

Figure 2G:
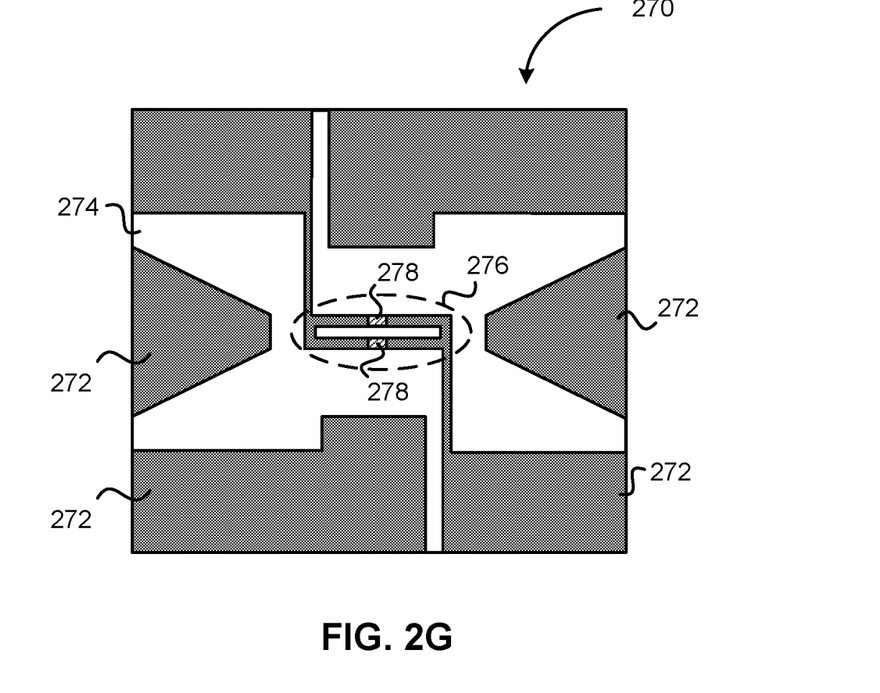
FIG. 2G depicts a layer as shown in FIG. 2A, formed into plurality of superconducting quantum interference device (SQUID) probes configured as a loop, according to one embodiment. The SQUID probes are shown from a top view, and may optionally include a thin protective film (not shown), in various approaches.

In more embodiments, a superconducting device may be in the form of a SQUID loop 270, and may have a geometry and configuration substantially as shown in FIG. 2G. SQUID loop 270 is similarly comprised of a material 272 as disclosed herein, said material being formed on a substrate 274 according to a predetermined pattern. In FIG. 2G, the predetermined pattern defines a loop in region 276 comprising the material formed in a substantially rectangular configuration. The loop includes junctions 278 approximately at a midpoint of each longitudinal portion of the loop in region 276. At the junctions 278, the thickness of the material is reduced compared to other superconducting portions of the SQUID loop 270, but maintains a constant width as compared to immediately adjacent portions within region 276.

In devices disclosed herein, it is particularly advantageous to exclude several classes of fluctuators. Fluctuators should be understood as any objects (quantum object) in materials which can change state and this way affect a state of the device. Fluctuators can spontaneously change state (e.g. due to thermal activation or quantum tunneling). Alternatively, state changes may be induced by external effects, by interaction with other fluctuators, by interaction with the device (particularly via currents flowing in the device or changes in electric or magnetic fields of the device itself), etc. as would be understood by a person having ordinary skill in the art upon reading the present descriptions.

For example, in one embodiment employing zero-spin material it is advantageous to exclude all types of fluctuators associated with nuclear orientation effects, such as clusters of nuclear ordering in metals, crystalline lattice defect sites (where Nuclear Quadrupole resonance frequency can match operation frequency of the device), and/or effects tending to cause free electron spins on the surfaces and interfaces (which disadvantageously allows interaction of nuclear orientation with other defects and/or with "jumping atoms").

In single crystal materials it is also advantageous to exclude "jumping" atoms, ions, and electrons on internal (inter-grain) boundaries. In embodiments where the material is formed into a suspended device, such as a suspended NanoSQUID device, it is preferable to avoid defects (fluctuators) on the crystal-substrate interface.

For example, metal surfaces often include oxide(s) or patina(s), and/or presence of localized surface electrons which can change location or orientation of the electron magnetic moment. Atomic nuclei are also free to change orientation up to the lowest available temperatures. The later problem is solved by choosing isotopes with zero nuclear spins: in this case nuclei are spherically-symmetric, so there are no entropy associated with changes of nuclear orientation.

To address this problem of spins of localized electrons that can change orientation on the metal (single-crystal) surface, it is preferable to form materials that exclude surface defects, e.g. via careful application of known growth techniques or use of surface treatment(s) that will make the orientation of localized surface electron spins (magnetic moment) fixed (frozen) at low temperatures. For example, in one approach it is possible to use known passivation techniques to address surface defects. Another approach is to apply an electric field to the surface and change the distribution/population of surface (defect) states of the material.

In this manner, it is possible to minimize or eliminate the additional noise contribution from changes in electron magnetic moment arising from spin-flip events. It is also possible to affect occupation of mentioned surface electron state by changing electrostatic potential of the surface by application of voltage in between the single-crystal metal device and a surrounding conductive enclosure (e.g. a Faraday cage).

Uses and Applications

As discussed in some detail above, the presently disclosed materials and methods of fabricating said materials are useful in a wide range of applications relating generally to hyper-sensitive detectors such as SQUIDs, single-photon mid- and far-IR detectors, single electron transistors, microwave resonators, etc. as would be understood by one having ordinary skill in the art upon reading the present descriptions.

In addition, because the inventive materials and methods disclosed herein provide uniquely low inherent noise contributions, e.g. due to quantum effects such as nuclear spins and nuclear electric quadrupole moments, it would be useful to employ such materials and methods in superconductor elements and applications.

For instance, present-generation semiconductor supercomputing systems require immense power and extremely efficient cooling systems to maintain operational conditions and performance. Superconducting computer elements can be used to make power consumption essentially lower. By employing materials and methods as disclosed herein, the resulting superconducting elements are expected to produce significantly less noise contribution and therefore provide significantly more efficient operational performance than existing superconducting elements. A beneficial consequence includes faster operation, substantial reduction of the power and/or cooling requirements to maintain superconducting operational conditions.

For example, in one approach a superconducting device may include a plurality of superconducting elements arranged in a predetermined geometry, preferably chosen based on the application to which the superconducting device is designed or configured, as would be understood by one having ordinary skill in the art upon reading the present descriptions. For instance, the geometry may be chosen depending on a particular wavelength and/or frequency range at which the device is configured to operate.

In particularly preferred embodiments, the geometry includes a plurality of superconducting elements arranged as a suspended SQUID, such shown in FIG. 2F. The suspended components may be coupled galvanically, e.g. via one or more metal bridges (such as wires) physically connecting the suspended components. Alternatively, suspended components may be inductively and/or capacitively coupled using techniques and/or configurations known in the art.

In one example, an advantageous application includes forming or obtaining a superconducting quantum interference device (SQUID) from the materials as described herein; placing the SQUID in proximity to a quantum object, wherein the proximity is sufficient to observe electromagnetic interaction between the SQUID and the quantum object; and measuring a magnetic flux passing through the SQUID. Notably, and unique to the materials disclosed herein, the magnetic flux is generated solely in response to interaction between the SQUID and the quantum object rather than interactions within the SQUID because such interactions have been suppressed. This allows more sensitive and informative interrogation of quantum objects using devices formed from materials as described herein.

Use of such a device with materials disclosed herein advantageously suppresses magnetic noise arising from localized electron moments and nuclear orientation effects within the superconducting device, e.g. arising due to changes in spin orientations.

While various embodiments have been described above, it should be understood that they have been presented by way of example only, and not limitation. For example, any one embodiment may be implemented in conjunction with features from any other embodiment listed herein, such as those described with reference to the other FIGS.

Further, the embodiments may be used in various applications, devices, systems, methods, etc. and/or in various permutations, which may or may not be specifically described in the illustrative embodiments listed herein. Thus, the breadth and scope of the embodiments should not be limited by any of the above-described exemplary embodiments, but should be defined only in accordance with the following claims and their equivalents.

What is claimed is:

1. A product, comprising:
    one or more isotopes exhibiting substantially zero nuclear spin;
    wherein the one or more isotopes are formed into a single crystal consisting essentially of a single crystalline phase; and
    wherein the one or more isotopes are selected from the group consisting of: $^{14}N$ $^{15}N$ $^{30}Si$, $^{46}Ti$, $^{48}Ti$, $^{50}Ti$, $^{64}Zn$, $^{66}Zn$, $^{68}Zn$, $^{70}Zn$, $^{92}Mo$, $^{94}Mo$, $^{96}Mo$, $^{98}Mo$, $^{100}Mo$, $^{102}Pd$, $^{104}Pd$, $^{106}Pd$, $^{108}Pd$, $^{110}Pd$, $^{123}Te$, $^{128}Te$, $^{180}W$, $^{182}W$, $^{184}W$, $^{186}W$, $^{190}Pt$, $^{192}Pt$, $^{194}Pt$, $^{196}Pt$, $^{198}Pt$, $^{204}Pb$, $^{206}Pb$, $^{204}Pb$, and combinations thereof.

2. The product as recited in claim 1, wherein the product is a single-electron transistor.

3. The product as recited in claim 1, wherein the product is a superconducting quantum bit.

4. The product as recited in claim 1, wherein the product is a probe of a superconducting quantum interference device (SQUID).

5. The product as recited in claim 1, wherein the single crystal is substantially devoid of sources of noise.

6. The product as recited in claim 1, wherein the single crystal is substantially devoid of surface defects.

7. The product as recited in claim 1, wherein the single crystal is substantially devoid of lattice vacancies.

8. The product as recited in claim 1, wherein the single crystal is substantially devoid of grain boundaries.

9. The product as recited in claim 1, wherein the single crystal is substantially devoid of inclusions.

\* \* \* \* \*